US012776365B2

(12) United States Patent
Kumar et al.

(10) Patent No.: US 12,776,365 B2
(45) Date of Patent: Oct. 27, 2026

(54) INCREASED THROUGHPUT FOR READS IN STATIC RANDOM ACCESS MEMORY

(71) Applicant: Arm Limited, Cambridge (GB)

(72) Inventors: Akshay Kumar, New Delhi (IN); Edward Martin McCombs, Jr., Austin, TX (US); Rahul Mathur, Austin, TX (US); Gaurav Kumar, Noida (IN)

(73) Assignee: ARM LIMITED, Cambridge (GB)

( * ) Notice: Subject to any disclaimer, the term of this patent is extended or adjusted under 35 U.S.C. 154(b) by 108 days.

(21) Appl. No.: 18/436,228

(22) Filed: Feb. 8, 2024

(65) Prior Publication Data

US 2025/0259671 A1 Aug. 14, 2025

(51) Int. Cl.
*G11C 11/418* (2006.01)
*G11C 11/419* (2006.01)

(52) U.S. Cl.
CPC .......... *G11C 11/419* (2013.01); *G11C 11/418* (2013.01)

(58) Field of Classification Search
CPC ............................ G11C 11/418; G11C 11/419
USPC .......................................................... 365/154
See application file for complete search history.

(56) References Cited

U.S. PATENT DOCUMENTS 6,181,608 B1 1/2001 Keshavarzi et al.
6,181,612 B1 1/2001 Wada
7,319,632 B2 * 1/2008 Jung .................... G11C 7/1075 365/154
10,770,132 B1 * 9/2020 Jung ..................... G11C 11/418
2001/0043482 A1 11/2001 Takeyama et al.
2014/0032812 A1 * 1/2014 Ong ................... G11C 13/0007 711/102
2014/0036610 A1 * 2/2014 Ramamurthy ........ G11C 11/419 365/203
2019/0198093 A1 * 6/2019 Khellah ................... G11C 7/12
2020/0098422 A1 3/2020 Nguyen et al.
2021/0027833 A1 1/2021 Chowdhury et al.
2021/0193196 A1 * 6/2021 Augustine ................ G11C 7/12
2023/0075959 A1 * 3/2023 Liu .......................... G11C 8/08
2023/0206995 A1 6/2023 Schreiber et al.

FOREIGN PATENT DOCUMENTS

WO 2023034370 A1 3/2023

OTHER PUBLICATIONS

Corrected Notice of Allowability issued in U.S. Appl. No. 18/436,147, mailed Mar. 24, 2025, 3 pages.
Combined Search and Examination Report issued in United Kingdom Application No. 2501081.0, mailed Jun. 23, 2025, 8 pages.
Combined Search and Examination Report issued in United Kingdom application No. 2501082.8, mailed Jul. 1, 2025, 10 pages.

* cited by examiner

*Primary Examiner* — Sung Il Cho
(74) *Attorney, Agent, or Firm* — Talem IP Law, LLP

(57) ABSTRACT

A read circuitry for memory includes a column read-out multiplexer (MUX) coupled to a set of columns of the memory, wherein the column read-out MUX receives a column select signal from a control circuit to output a corresponding column output from the set of columns; and a single sense amplifier coupled to receive the corresponding column output of the column read-out MUX.

19 Claims, 10 Drawing Sheets

INCREASED THROUGHPUT FOR READS IN STATIC RANDOM ACCESS MEMORY

BACKGROUND

Random Access Memory (RAM) is a type of volatile memory typically used as the main or primary memory for a processing unit and stores the programs and data that the processing unit is using during execution of a program. Static Random Access Memory (SRAM) is typically the type of memory used for caches. SRAM is generally configured as an array, or matrix, of memory units that are individually addressable. Read and write operations are performed on units of data referred to as words. That is, a word refers to a unit of data used by a particular processor design or instruction set.

In general, wordlines are used to select a row for reading or writing and bitlines carry data to/from a column. For the read operation in SRAM, the address of a storage location for a word is transferred to an address line, a pre-charge circuit is used to bring bitlines to VDD, the wordline is driven high (pre-charge circuit is turned off), the cells storing the data at the storage location pull down one bitline, and a sense circuit on a periphery of the array is activated to capture the value on the bitlines. For the write operation in SRAM, the address of a desired word is transferred to a specific address on the wordline and column, data bits to be stored in the memory are transferred to the bitlines, which are driven by a column driver circuit, and the write control is activated to drive the wordline high (while the column driver stays on) and drive the data into the cells being written.

The speed of a processing unit is determined by how many calculations a processor can perform per clock cycle. However, one limiting factor to the performance of a processing unit is the speed at which the data stored in memory can be read and written. Row and column changes, changing between commands, and other operations can contribute to higher latencies. Identifying mechanisms to reduce the number of clock cycles to deliver data (both to memory as a write operation and to a processing unit as a read operation) continues to be important for performance.

BRIEF SUMMARY

Circuitry and techniques supporting increased throughput for reads from memory are described. An increased throughput refers to the ability to write, read, and access multiple bitcells of a memory in fewer clock cycles compared to the writing, reading, or accessing of the multiple bitcells individually. A "blast mode" is provided in which more than one word is written or read on a given wordline across multiple columns which results in increased throughput. Advantageously, the described circuitry and techniques can provide an area and leakage efficient readout solution.

As described in detail herein, a method for a read operation, including a blast read operation, can include initiating a read operation during a first clock cycle; operating a column read-out multiplexer (MUX) coupled to a set of columns of the memory by individually applying one of n column select signals to the column read-out MUX to connect n columns of the set of columns to a single sense amplifier that is coupled to the column read-out MUX in corresponding clock cycles starting from a second clock cycle such that all n columns are read out in n+1 clock cycles, where n is an integer equal to or greater than 1; and capturing a corresponding column output of the column read-out MUX at the single sense amplifier in the corresponding clock cycle.

A read circuitry for memory includes a column read-out multiplexer (MUX) coupled to a set of columns of the memory, wherein the column read-out MUX receives a column select signal from a control circuit to output a corresponding column output from the set of columns; and a single sense amplifier coupled to receive the corresponding column output of the column read-out MUX. The columns can be read out non-consecutively.

A memory circuitry including the above read circuitry can further include a wordline driver coupled to receive an address and select a corresponding wordline for the memory; and a control circuit for operating the wordline driver and the read circuitry.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Circuitry and techniques supporting increased throughput for reads from memory are described. An increased throughput refers to the ability to write, read, and access multiple bitcells of a memory in fewer clock cycles compared to the writing, reading, or accessing of the multiple bitcells individually. A "blast mode" is provided in which more than one word is written or read on a given wordline across multiple columns which results in increased throughput. Advantageously, the described circuitry and techniques can provide an area and leakage efficient readout solution.

Figure 1A:
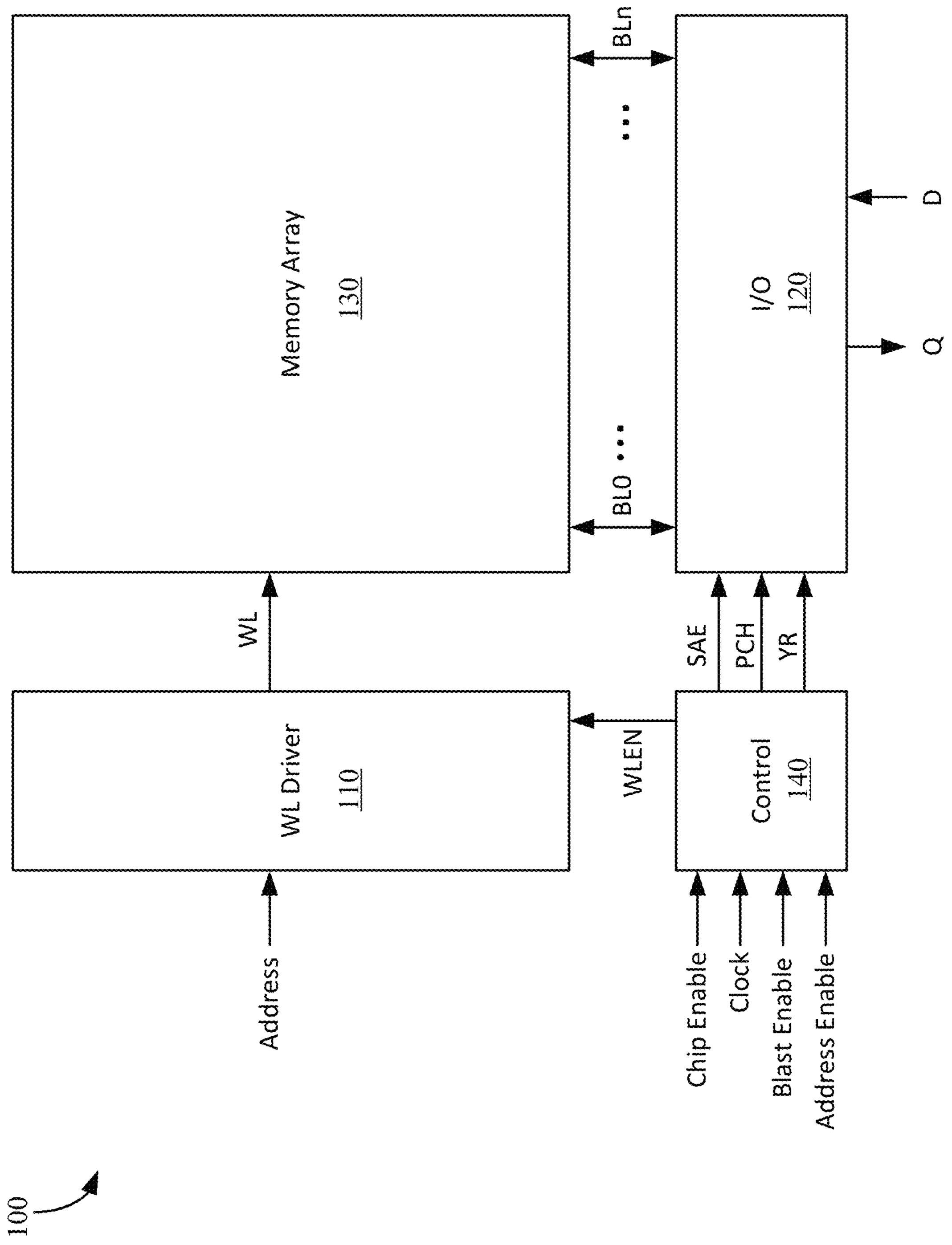
FIG. 1A shows a representational diagram of a memory circuitry.
Figure 1B:
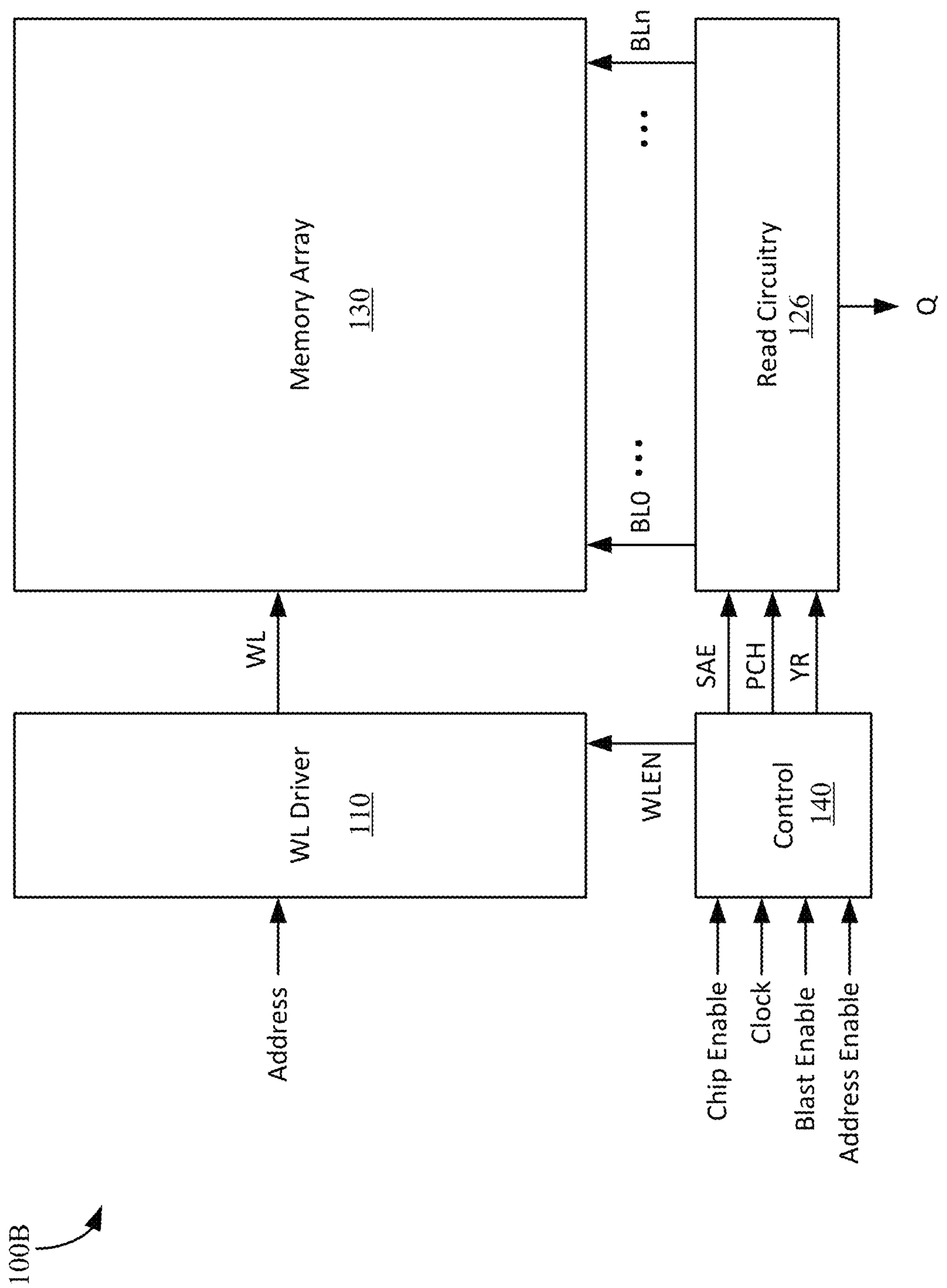
FIG. 1B shows a representational diagram of a memory circuitry for performing read operations.

FIG. 1A shows a representational diagram of a memory circuitry; and FIG. 1B shows a representational diagram of a memory circuitry for performing read operations.

Referring to FIG. 1A, memory circuitry 100 includes a wordline (WL) driver 110 and input/output circuitry 120 for a memory array 130. The WL driver 110 and the input/output circuitry 120 operate under the control of a control circuit 140. In some implementations, the memory circuitry 100 is cache circuitry.

The memory 130 is structured in an array with rows accessed by wordlines and columns accessed by bitlines. In certain implementations, the memory 130 is a static random access memory (SRAM). The structure of each bitcell of the memory can be 1:1:1 bitcells, 1:1:2 bitcells, or 1:2:2 bitcells, as examples. The bitcells may be implemented in FinFET processes, planar processes, nanosheet processes, FDSOI processes, or other suitable technologies. A bitcell refers to the memory element storing a single bit of information.

The control circuit 140 can receive a chip enable signal, a clock signal, a blast enable signal, and an address enable signal and generate outputs to control the WL driver 110 and the I/O circuitry 120. The chip enable signal indicates whether the memory will be accessed or not. The clock signal indicates the start of an operation for memory and provides the operating frequency for the circuitry. The blast enable signal indicates whether the operation being performed at the memory is in blast mode. The address enable signal supports out-of-order bitcell access. Out-of-order bitcell access refers to the ability to write or read (or otherwise access) bitcells on a non-consecutive basis. That is, by using the address enable signal, which indicates which bitlines are going to be accessed during the blast mode, it is possible to have multiple words read or written to non-consecutive bitcells of a row. The address enable signal can be implemented using individual address pins. In some cases, the address enable signal is a decoded blast address indicating which of the columns are to be accessed for a blast operation. In some cases, an encoded blast address may be used.

The WL driver 110 receives an address and turns on a wordline indicated by the address in response to receiving a wordline enable (WLEN) signal from the control circuit 140.

The input/output circuitry 120 can include write circuitry and read circuitry. Data (D) is received for write operations and Data (Q) is output for read operations. The input/output circuitry 120 receives a sense amplifier enable (SAE) signal, a precharge (PCH) signal, and a read column select (YR) signal from the control circuit 140. In the case of read circuitry 125, the control circuit 140 provides a sense amplifier enable (SAE) signal, a precharge (PCH) signal, and a read column select (YR) signal, as illustrated by the memory circuitry 100B shown in FIG. 1B.

Referring to FIG. 1B, the memory circuitry 100B includes a wordline driver 110 for the memory 130, where the wordline driver 110 is coupled to receive an address and select a corresponding wordline for the memory 130; a read circuitry 126; and a control circuit 140 for operating the wordline driver 110 and the read circuitry 126.

For a blast mode read operation, the control circuit 140 receives a chip enable signal, clock signal, blast enable signal, and address enable signal; and, using the received signals, generates appropriate signals to output the wordline enable (WLEN) signal to the wordline driver 110 and to output the sense amplifier enable (SAE) signal, the precharge (PCH) signal, and the appropriate read column select (YR) signal to the read circuitry 126. The read column select (YR) signals are based on the address enable signal received by the control circuit 140 and can be used to generate local control signals for operating the read out circuitry. In some cases, the control circuit 140 performs the method 300 described with respect to FIG. 3.

As mentioned above, for the read operation in a memory such as SRAM, the address of a storage location for a word is transferred to an address line, a pre-charge circuit is used to bring bitlines to VDD, the wordline is driven high (pre-charge circuit is turned off), the cells storing the data at the storage location pull down one bitline, and a sense circuit on a periphery of the array is activated to capture the value on the bitlines. In detail, the read cycle may be started by precharging the bitlines (e.g., bitline and bitline bar of each bitcell). When a wordline is asserted, the access transistors of a cell are enabled, which can cause one bitline voltage to slightly drop, resulting in a small voltage difference between the bitline and bitline bar. A sense amplifier can sense which line has the higher voltage and thus determine whether there was 1 or 0 stored.

Figure 2A:
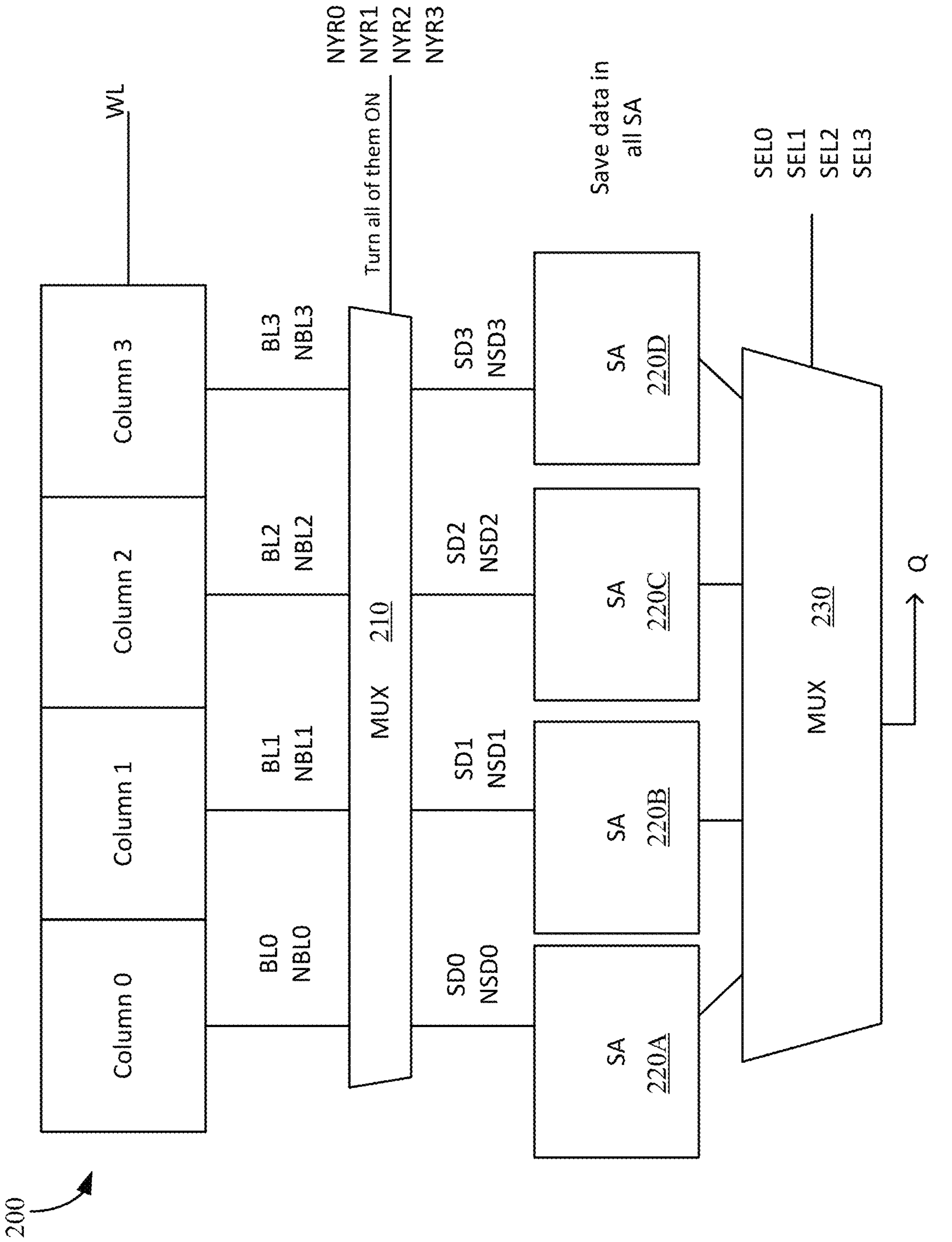
FIG. 2A illustrates an existing readout circuitry that supports an increased-throughput read.

FIG. 2A illustrates an existing readout circuitry that supports an increased-throughput read. Referring to FIG. 2A, an existing readout circuitry 200 includes a first MUX 210 that is used to select one bitline pair out of the set of bitlines. When the wordline (WL) is turned on, bitline differential is developed on each column (e.g., column 1, column 2, column 3, column 4) by activating all the paths in the first MUX 210 using NYR0, NYR1, NYR2, NYR3. At the arrival of the SAE signals, these differentials are captured into the corresponding sense amplifiers 220A, 220B, 220C, 220D at once. The captured data is then individually read out from the sense amplifiers 220A, 220B, 220C, 220D in consecutive clock cycles using a second MUX 230 at the output which is controlled by SEL0, SEL1, SEL2, SEL3 signals.

Figure 2B:
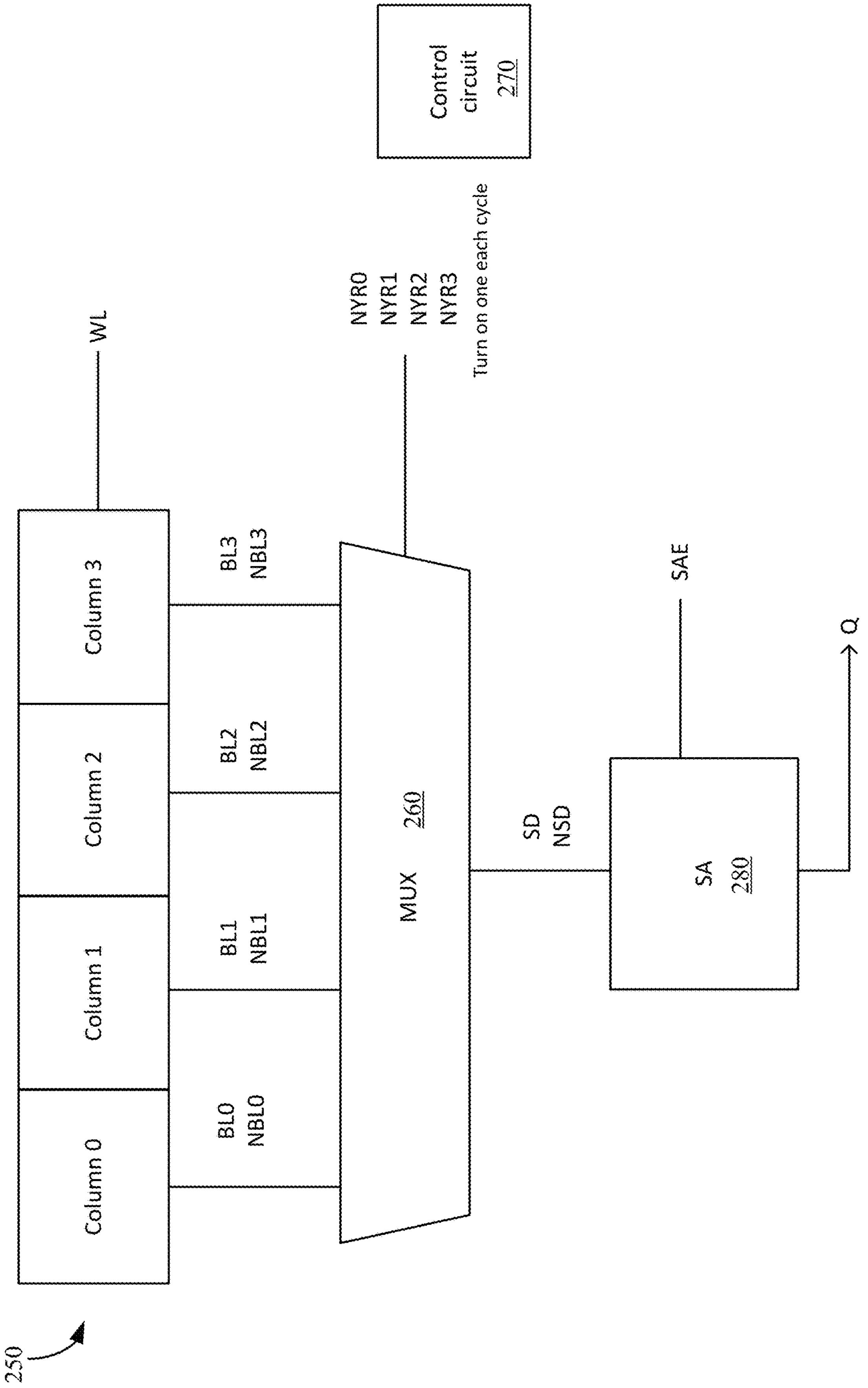
FIG. 2B illustrates a readout circuitry that can support an increased-throughput read.

FIG. 2B illustrates a readout circuitry that can support an increased-throughput read. Referring to FIG. 2B, a readout circuitry 250 providing an area and leakage efficient readout solution includes a column read-out multiplexer (MUX) 260 coupled to a set of columns of the memory (e.g., column 1, column 2, column 3, column 4).

In operation, the wordline (WL) is turned on and all columns begin to develop bitline differential. This differential from each column is selected to drive the inputs of the single sense amplifier 280 in a corresponding clock cycle by the column read-out MUX 260 receiving a column select signal (one of NYR0, NYR1, NYR2, NYR3) from the control circuit 270 (which can be an embodiment of control circuit 140 described with respect to FIGS. 1A and 1B); and a single sense amplifier 280 coupled to receive the corresponding column output of the column read-out MUX 260 that was selected by the column select signal.

The control circuit 270 directs the wordline driver to turn on a single selected wordline (WL) during a first clock cycle. In addition, the control circuit 270 directs the read circuitry to precharge bitlines of the memory; and operate the column read-out MUX 260 to connect n columns of the set of columns to the single sense amplifier 280 (enabled using the SAE signal) in corresponding clock cycles starting from a second clock cycle such that all n columns are read out in n+1 clock cycles, where n is an integer equal to or greater than 1. In particular, whichever one or more columns are desired to be read, each one is read out one at a time. Furthermore, the columns can be selected non-consecutively, allowing for out of order reads (where columns/bitcells can be skipped). It should be noted that the described circuitry for a set of bitcells/set of bitlines/set of columns may represent a single slice (i.e., one bit deep) of a word.

Figure 3:
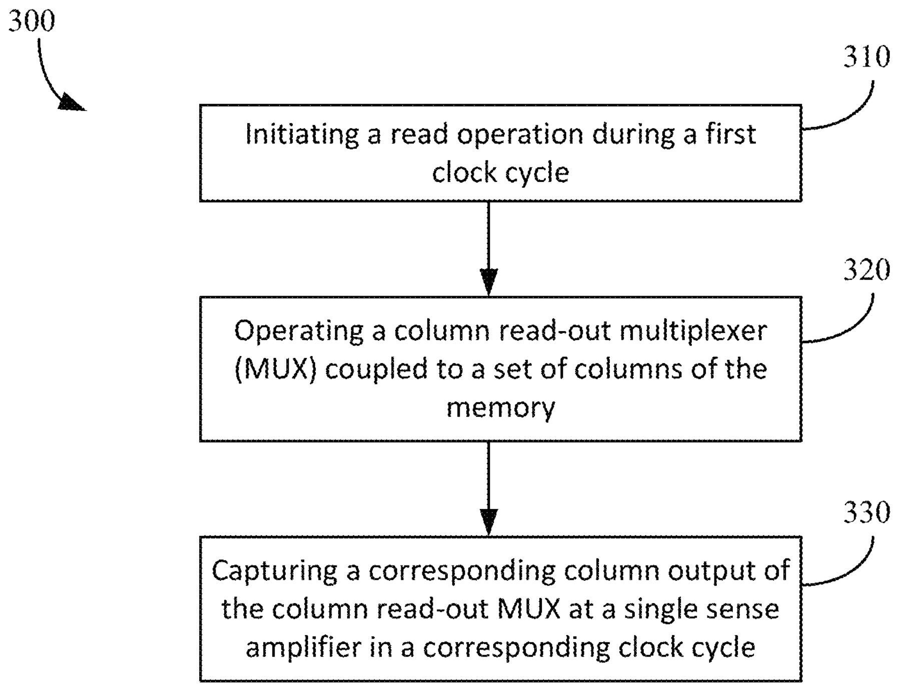
FIG. 3 illustrates a method for read operations from memory.

FIG. 3 illustrates a method for read operations from memory. Referring to FIG. 3, a method 300 of read operations from memory can include initiating (310) a read operation during a first clock cycle; operating (320) a column read-out multiplexer (MUX) coupled to a set of columns of the memory by individually applying one of n column select signals to the column read-out MUX to connect n columns of the set of columns to a single sense amplifier that is coupled to the column read-out MUX in corresponding clock cycles starting from a second clock cycle such that all n columns are read out in n+1 clock cycles, where n is an integer equal to or greater than 1; and capturing (330) a corresponding column output of the column read-out MUX at the single sense amplifier in the corresponding clock cycle.

Initiating (310) the read operation can include turning on a single selected wordline during a first clock cycle. As described in more detail with respect to FIG. 6A, the single selected wordline can be maintained as on until the n+1 clock cycle.

Initiating (310) the read operation can include precharging the bitlines of the memory. The single sense amplifier can be precharged during this initiation step as well.

When operating (320) the column read-out MUX, individually applying the one of n column select signals to the column read-out MUX can include selecting non-consecutive columns in consecutive clock cycles.

It is possible to sequence multiple read operations that support the reading of a bitcell to finish within one clock cycle by taking advantage of the fact that all columns on the same wordline start generating a bitline differential at the start of the 1$^{st}$ cycle when the wordline goes high. As described in more detail with respect to FIG. 6A, the wordline stays high for the entire duration of the blast operation, providing sufficient differential between bitlines of a column to be sampled into the sense-amplifier.

Figure 4:
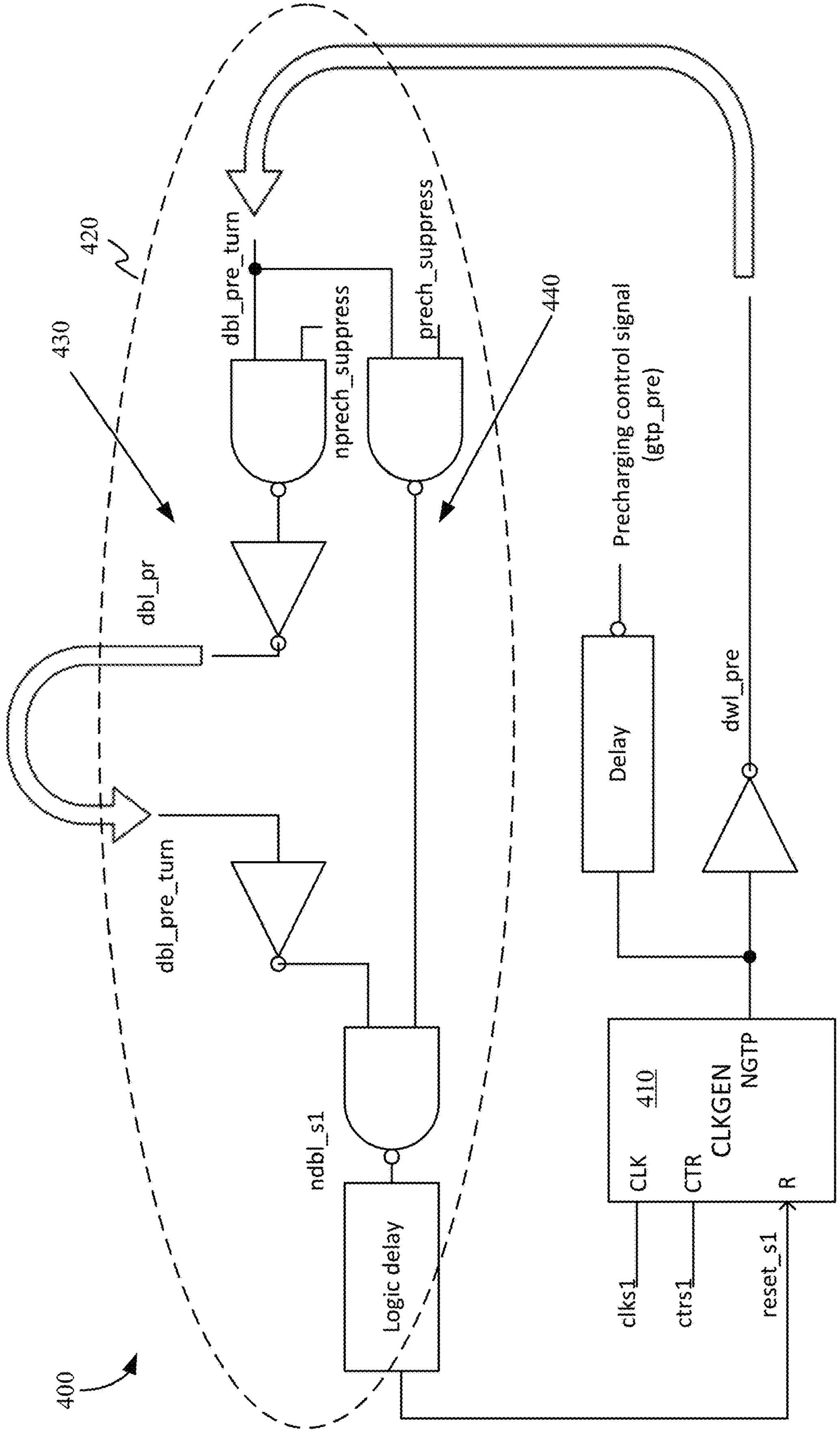
FIG. 4 illustrates an example circuit for generating a control signal that can be used to perform faster sense amplifier precharge for blast reads.

The multiple read operations to take place starting from the rising clock edge of the second clock cycle in a blast mode read operation and which need to complete before the next edge of the clock, which will generate the sense amplifier enable (SAE) signal again include:

1. A local sense amplifier enable signal, sae, rises, leading to sense-amp operation. A new value of sao (sense-amp output) is ready to be stored into the Q retention flop.
2. A local clock signal, gtp, falls, leading to closure of the active column select (nyr) signal and closure of active local sense amplifier enable signal, sae. In parallel, sao is stored into the Q retention flop.
3. With the falling edge of the local clock signal, gtp, the falling edge of gtp_sa is detected, and this triggers another gtp_pre signal to start another precharge of the sense-amplifier nodes.
4. A precharging control signal, gtp_pre, is a self-timed signal that is made wide enough so that the sense-amplifier nodes can precharge. The circuit shown in FIG. 4 illustrates an example configuration for generating the precharging control signal.
5. When gtp_pre falls, then gtp is re-triggered, leading to a new nyr selection.
6. Once nyr (e.g., nyr0, nyr1, nyr2, nyr3 of FIG. 2B) falls, the differential that has already been developed on the BL/NBL pair chosen in this cycle gets transferred on to the sense-amp node, and the circuit waits for the next CLK edge so that the sae signal can rise again and store this value.
7. This sequence of events needs to happen before the start of the next CLK cycle, otherwise, the SAE would come too early, and the differential on the BL would not be transferred to the SD/NSD (SA) nodes.

The precharging control signal supports the ability to perform the above sequence of events within a clock cycle. In the operations before the second clock cycle, the precharging control signal is used to control the precharging of the bitlines. For example, the width of the gtp_pre signal is optimized during design so that the bitlines can precharge from 0 (worst case) to a high percentage (such as 95%) of VDD. This can be a long duration. For example, a 512 rpb architecture, can take time for the bitlines to precharge. Comparatively, in the subsequent clock cycles, since the bitlines do not have to be precharged and only the single sense amplifier is precharged, the pulse width of gtp_pre can be much smaller and still accomplish the precharge functionality. This can reduce the time needed between two nyr signals, allowing more time for the sense-amplifier nodes to get the differential from the bitline.

A precharge generating circuit can be used to generate a precharging control signal having two different widths, where a larger of the two different widths is output for applying voltage to precharge the bitlines of the memory and a smaller of the two different widths is output from the second clock cycle to the n+1 clock cycle for applying voltage to precharge the single sense amplifier. In this manner, selective precharging is provided.

By utilizing the circuit shown in FIG. 4, it is possible to reduce the pulse width of gtp_pre when the operation is not in the 1$^{st}$ CLK cycle by using the prech_suppress signal, which detects the first CLK cycle, and goes high when the 1$^{st}$ operation is completed. This reduces the sense-amp precharge time and helps to optimize the cycle time.

FIG. 4 illustrates an example circuit for generating a control signal that can be used to perform faster sense amplifier precharge for blast reads. Referring to FIG. 4, a precharge generating circuit 400 can include a precharge clock generator 410 that turns on a pulse for the precharging control signal (gtp_pre) in response to receipt of a clock signal. The clock signal received by the precharge clock generator 410 can include clks1, which is the clock edge based on the chip enable (CEN) signal (e.g., CEN described with respect to FIG. 1A). The precharge clock generator 410 can also receive ctrs1 signal, which is a control input that turns high based on a rising edge of the sense amplifier enable (SAE) signal (e.g., SAE described with respect to FIG. 1A) and turns low based on the rising edge of the last cycle.

The precharge generating circuit further includes a reset circuit 420 structured to receive the pulse for the precharging control signal (as dwl_pre) from an output of the clock generator and a first clock cycle signal (prech_suppress/nprech_suppress) from a first clock cycle detector and output a reset signal (reset_s) to the clock generator that turns off the pulse for the precharging control signal (gtp_pre). The reset circuit 420 has a first path 430 of a first delay period in response to the first clock cycle signal indicating a detected first clock cycle and a second path 440 of a second delay period for subsequent clock cycles of an operation after the detected first clock cycle. Through incorporating a longer signal path for the first path 430 as compared to the second path 440, the first delay period for the first clock cycle is larger than the second delay period for the subsequent clock cycles of the operation.

In operation, the precharge pulse starts with the receipt of the clock signal. Then, when the feedback loop completes (e.g., either through the first path 430 or the second path 440), the pulse is stopped.

Figure 5:
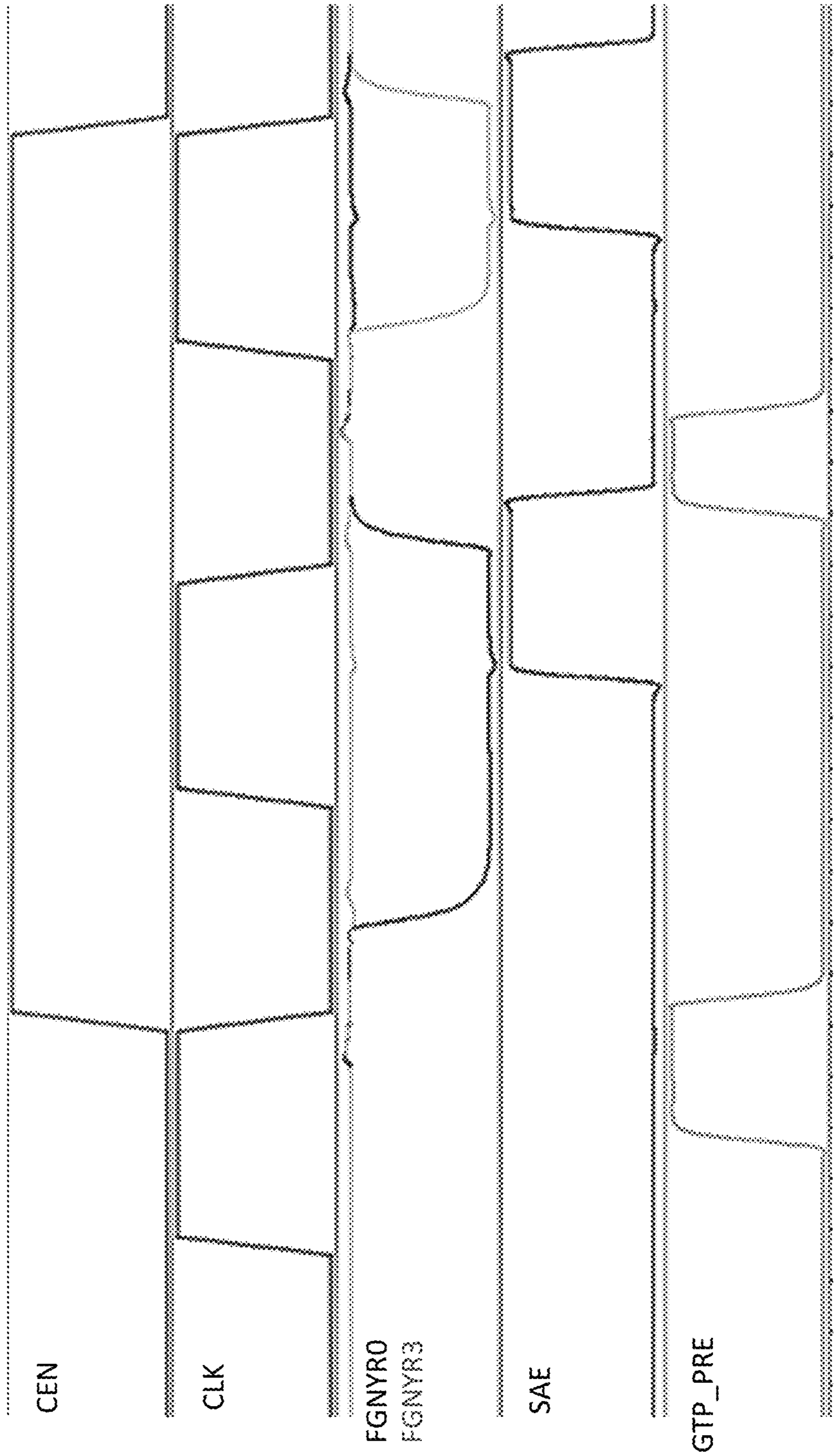
FIG. 5 shows waveforms of voltage over time for various signals for read operations.

FIG. 5 shows waveforms of voltage over time for various signals for read operations. In the scenario illustrated in FIG. 5, two words are read from memory, where one is read from a first column and the other is read from a fourth column (reflected by the column select control signals FNYR0 and FGNYR3). Referring to FIG. 5, in a first clock cycle (CLK), a precharge control signal (GTP_PRE) pulse has a first width, which is suitable for precharging the bitlines. In a second clock cycle the sense amplifier enable (SAE) signal is on, the first column is selected, and at the falling edge of the second clock, the precharge control signal (GTP_PRE) is asserted. As shown in FIG. 5, the second GTP_PRE pulse is a shorter pulse leading to FGNYR3 arriving earlier and allowing more sense-amp differential to be created before the second SAE pulse.

Figure 6A:
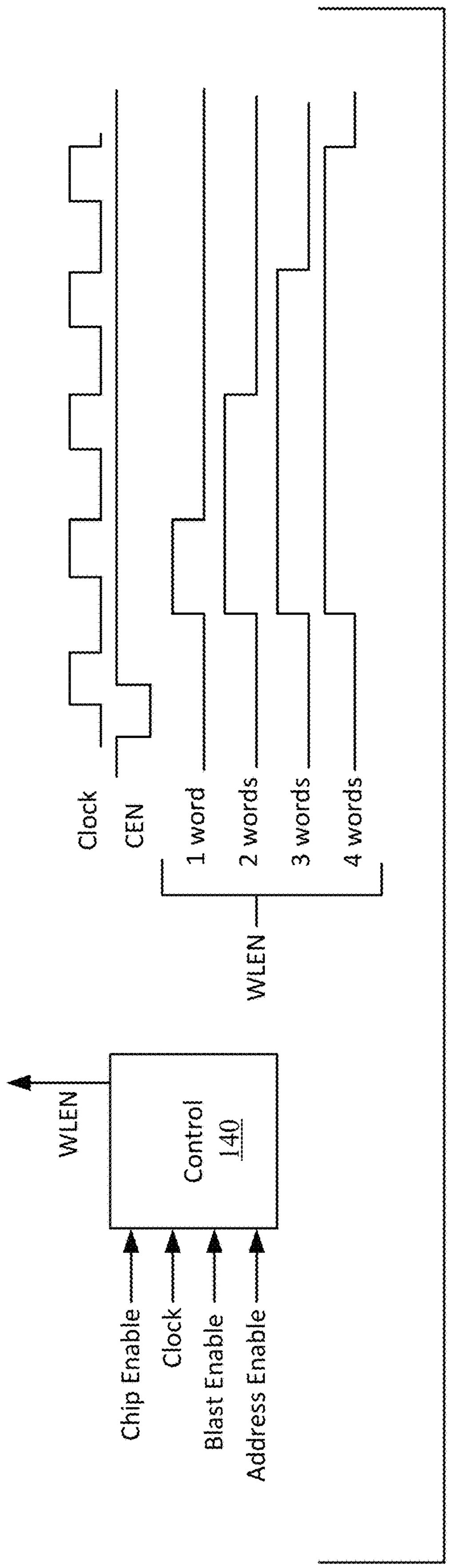
FIG. 6A shows operation of a control circuit for control of a wordline driver.

FIG. 6A shows operation of a control circuit for control of a wordline driver. As explained with respect to FIGS. 1A and 1B, control circuit 140 receives input signals, including chip enable, a clock signal, a blast enable signal, and an address enable signal and outputs a wordline enable signal to a wordline driver. In the timing diagram of FIG. 6A, signals for memory operations involving 1, 2, 3, and 4 words are shown. In a blast read operation multiple words (n words where n is an integer greater than 1) in the same physical row can be read out in consecutive clock cycles. Indeed, given an initial clock cycle for starting a read operation, n words can be read out in n additional (to the initial clock cycle) cycles (e.g., 4 words can be read out in 5 cycles).

However, because the number of words may differ for each read access (e.g., one read access may blast read 4 words and the next only 3 or 2 words), the length of time that a wordline is being used for the blast read can also differ for each read access. Accordingly, for the blast read operation, control circuit 140 directs the wordline driver to maintain the single selected wordline as on until the n+1 clock cycle. In some cases, the control circuit 140 turns off the single selected wordline during a falling edge of the n+1 clock cycle. That is, the wordline generated in the first cycle is made to continue to remain high until the last cycle of a blast read operation. This ensures that the bitline differential is created continuously on all columns that may be read out.

Figure 6B:
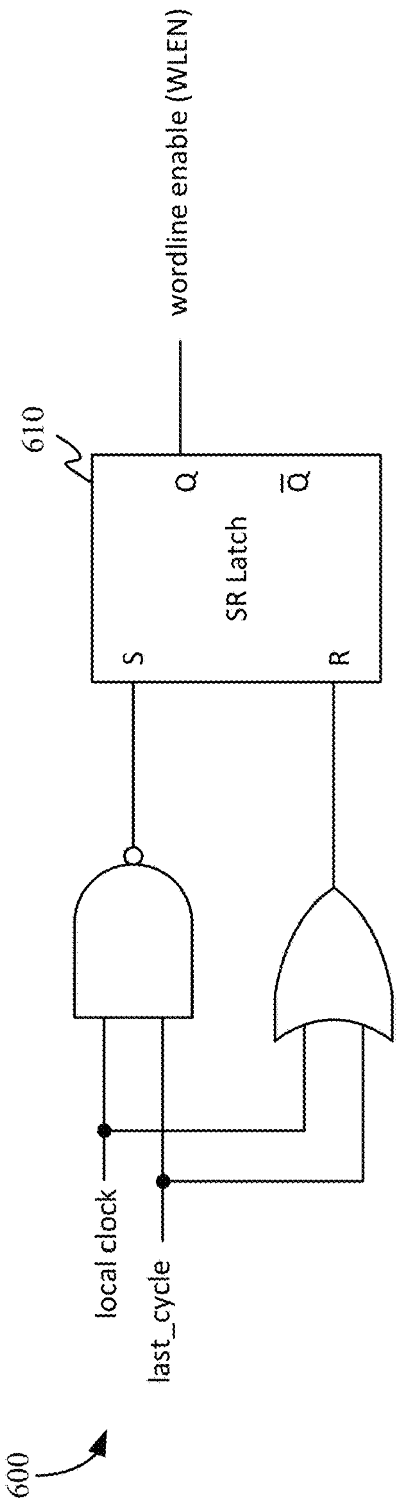
FIG. 6B shows a control circuit for generating a wordline enable signal.

FIG. 6B shows a control circuit for generating a wordline enable signal. Referring to FIG. 6B, a control circuit 600 for generating a wordline enable signal includes a latch 610. The latch 610 can be implemented, for example, as a SR latch. The latch 610 is structured to go high during a first clock cycle to output a wordline enable signal that directs the wordline driver to turn on the single selected wordline and is further structured to receive a last cycle signal that resets the wordline enable signal such that the wordline driver closes the single selected wordline in response to the last cycle signal indicating the last (e.g., n+1) clock cycle. Here, a local clock signal and the last cycle signal (last_cycle) are combined for use as SET and RESET inputs to the latch 610. A NAND gate can be used to keep the input high so long as the last_cycle remains low (i.e., that it is not yet the last cycle). An OR gate (or equivalent such as a NOR with an inverter) is used to permit a change of the SET value to be stored in the latch 610. That is, when the last_cycle is high, the RESET input is high and the latch 610 will update with the value at the SET input, which is low due to the last_cycle being high. In this manner, the local clock will not cause the wordline enable signal to go low until the last cycle of a blast operation is occurring. Indeed, the circuit 600 triggers a wordline off the first clock and closes the wordline off the last clock in the blast operation, which may vary depending on the depth of the blast read operation.

Figure 7:
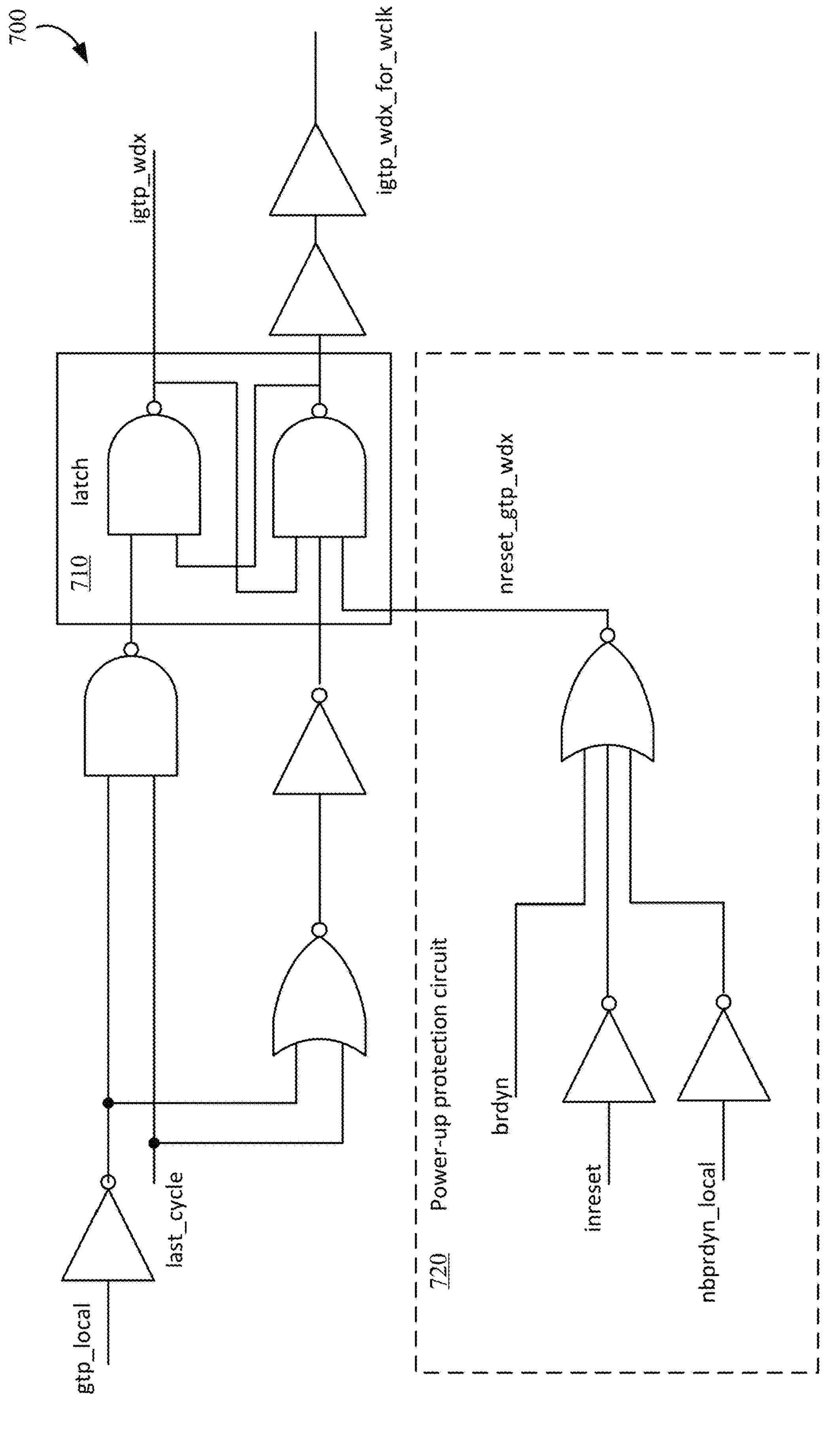
FIG. 7 shows a specific implementation of an example control circuit for generating a wordline enable signal.

FIG. 7 shows a specific implementation of an example control circuit for generating a wordline enable signal. Referring to FIG. 7, control circuit 700 includes circuitry for generating the wordline enable signal as described with respect to the control circuit 600 of FIG. 6B and further includes an optional power-up protection circuit. In detail, in circuit 700, SR latch 710 generates an igtp_wdx signal, which goes to the wordline decoder of the memory array to generate the wordline. The SET signal is generated with gtp_local rises and last_cycle=1. The RESET signal is generated when gtp_localfalls and last_cycle=0. Glitches in the wordline signal can be avoided or minimized by appropriate signal sequencing.

Figure 8:
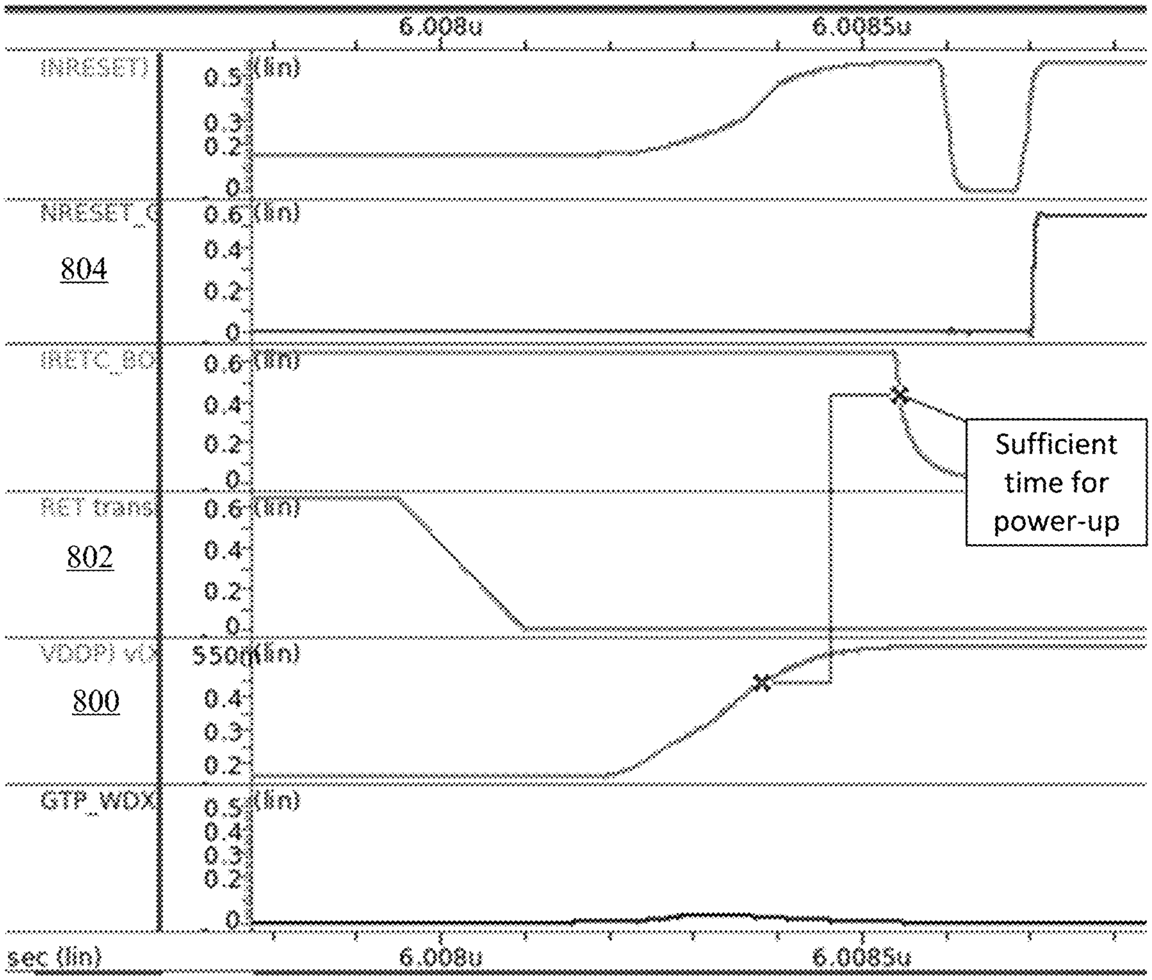
FIG. 8 shows waveforms of various signals on power-up and a result of incorporating a power-up protection circuit.

The power-up protection circuit 720 can be included to avoid or minimize potential glitching when a power-up occurs. For example, power-up protection circuit 720 can be located on the signal nreset_gtp_wdx. This signal is ensured to be 0 as power up occurs from retention mode, by a combination of three signals: 1) BPRDYN—this is a signal on VDDPE that tracks RET power up and falls only sufficiently after the internal VDDP headers have precharged to a sufficient value so that all logic is stable; 2) NBPRDYN_LOCAL—this is a delayed version of BPRDYN signal and is inserted into the circuit to ensure that there is no glitch on nreset_gtp_wdx signal itself, and 3) INRESET—this is the normal reset signal, that is triggered in normal operation by first NGTP_PRE, or by RESETN pin externally. FIG. 8 shows waveforms of various signals on power-up and a result of incorporating a power-up protection circuit. Referring to FIG. 8, it can be seen that when VDDPE 800 powers up after RET 802 goes low (indicating end of retention mode), the NRESET 804 signal does not switch until the VDDPE 800 is completely powered up.

Certain embodiments of the illustrated methods and memory circuitry include the following.

Clause 1. A memory circuitry, comprising: a wordline driver for a memory, the wordline driver coupled to receive an address and select a corresponding wordline for the memory; read circuitry; and a control circuit for operating the wordline driver and the read circuitry; wherein the read circuitry comprises: a column read-out multiplexer (MUX) coupled to a set of columns of the memory, wherein the column read-out MUX receives a column select signal from the control circuit to output a corresponding column output from the set of columns; and a single sense amplifier coupled to receive the corresponding column output of the column read-out MUX.

Clause 2. The memory circuitry of clause 1, wherein the control circuit directs the wordline driver to turn on a single selected wordline during a first clock cycle, and wherein the control circuit directs the read circuitry to: precharge bitlines of the memory; and operate the column read-out MUX to connect n columns of the set of columns to the single sense amplifier in corresponding clock cycles starting from a second clock cycle such that all n columns are read out in n+1 clock cycles, where n is an integer equal to or greater than 1.

Clause 3. The memory circuitry of clause 1 or 2, further comprising: a precharge control signal generating circuit that generates a precharging control signal having two different widths, wherein a larger of the two different widths is output for applying voltage to precharge the bitlines of the memory and a smaller of the two different widths is output from the second clock cycle to the n+1 clock cycle for applying voltage to precharge the single sense amplifier.

Clause 4. The memory circuitry of any preceding clause, wherein the precharge control signal generating circuit comprises: a precharge clock generator that turns on a pulse for the precharging control signal in response to receipt of a clock signal; and a reset circuit structured to receive the pulse for the precharging control signal from an output of the clock generator and a first clock cycle signal from a first clock cycle detector and output a reset signal to the clock generator that turns off the pulse for the precharging control signal, the reset circuit having a first path of a first delay period in response to the first clock cycle signal indicating a detected first clock cycle and a second path of a second delay period for subsequent clock cycles of an operation after the detected first clock cycle, wherein the first delay period for the first clock cycle is larger than the second delay period for the subsequent clock cycles of the operation.

Clause 5. The memory circuitry of any preceding clause, wherein the control circuit directs the wordline driver to maintain the single selected wordline as on until the n+1 clock cycle.

Clause 6. The memory circuitry of any preceding clause, wherein the control circuit comprises a latch structured to go high during the first clock cycle to output a wordline enable signal that directs the wordline driver to turn on the single selected wordline, wherein the latch is further structured to receive a last cycle signal that resets the wordline enable signal such that the wordline driver closes the single selected wordline in response to the last cycle signal indicating the n+1 clock cycle.

Clause 7. The memory circuitry of any preceding clause, further comprising: a Q retention flop coupled to the single sense amplifier to store an output of the single sense amplifier.

Clause 8. The memory circuitry of any preceding clause, wherein the set of columns comprises four columns of the memory.

Clause 9. The memory circuitry of any preceding clause, wherein the control circuit is structured to receive an address enable signal and generates column select signals based on columns identified by the address enable signal.

Clause 10. The memory circuitry of any preceding clause, wherein the address enable signal is a decoded blast address indicating which of the set of columns are to be accessed.

Clause 11. The memory circuitry of any preceding clause, wherein the control circuit has individual address pins for receiving the address enable signal, each pin corresponding to one column of the set of columns.

Clause 12. A method of read operations from memory, the method comprising: initiating a read operation during a first clock cycle; operating a column read-out multiplexer (MUX) coupled to a set of columns of the memory by individually applying one of n column select signals to the column read-out MUX to connect n columns of the set of columns to a single sense amplifier that is coupled to the column read-out MUX in corresponding clock cycles starting from a second clock cycle such that all n columns are read out in n+1 clock cycles, where n is an integer equal to or greater than 1; and capturing a corresponding column output of the column read-out MUX at the single sense amplifier in the corresponding clock cycle.

Clause 13. The method of clause 12, wherein individually applying the column select signal to the column read-out MUX comprises selecting non-consecutive columns in consecutive clock cycles.

Clause 14. The method of clause 12 or 13, wherein initiating the read operation comprises turning on a single selected wordline during a first clock cycle.

Clause 15. The method of any preceding method clause, further comprising maintaining the single selected wordline as on until the n+1 clock cycle.

Clause 16. The method of any preceding method clause, wherein initiating the read operation comprises precharging bitlines of the memory.

Clause 17. The method of any preceding method clause, further comprising: generating a precharging control signal having two different widths, wherein a larger of the two different widths is output for applying voltage to precharge the bitlines of the memory and a smaller of the two different widths is output from the second clock cycle to the n+1 clock cycle for applying voltage to precharge the single sense amplifier.

Clause 18. The method of any preceding method clause, wherein n=4.

Clause 19. The method of any preceding method clause, wherein operating the column read-out MUX comprises: receiving an address enable signal; and generating the n column select signals based on columns identified by the address enable signal.

Clause 20. The method of any preceding method clause, wherein the address enable signal is a decoded blast address indicating which of the set of columns are to be accessed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts that would be recognized by one skilled in the art are intended to be within the scope of the claims.

What is claimed is:

1. A method of read operations from memory, the method comprising:

initiating a read operation during a first clock cycle;

operating a column read-out multiplexer (MUX) coupled to a set of columns of the memory by individually applying one of n column select signals to the column read-out MUX to connect n columns of the set of columns to a single sense amplifier that is coupled to the column read-out MUX in corresponding clock cycles starting from a second clock cycle such that all n columns are read out in n+1 clock cycles, where n is an integer equal to or greater than 1, wherein individually applying the one of n column select signals to the column read-out MUX comprises selecting non-consecutive columns in consecutive clock cycles of the n+1 clock cycles, wherein at least one column of the set of columns is skipped during the n+1 clock cycles; and capturing a corresponding column output of the column read-out MUX at the single sense amplifier in the corresponding clock cycle.

2. The method of claim 1, wherein initiating the read operation comprises turning on a single selected wordline during a first clock cycle.

3. The method of claim 2, further comprising maintaining the single selected wordline as on until the n+1 clock cycle.

4. The method of claim 1, wherein initiating the read operation comprises precharging bitlines of the memory.

5. The method of claim 4, further comprising: generating a precharging control signal having two different widths, wherein a larger of the two different widths is output for applying voltage to precharge the bitlines of the memory and a smaller of the two different widths is output from the second clock cycle to the n+1 clock cycle for applying voltage to precharge the single sense amplifier.

6. The method of claim 1, wherein n=4.

7. The method of claim 1, wherein operating the column read-out MUX comprises:

receiving an address enable signal; and generating the n column select signals based on columns identified by the address enable signal.

8. The method of claim 7, wherein the address enable signal is a decoded blast address indicating which of the set of columns are to be accessed.

9. A memory circuitry, comprising:

a wordline driver for a memory, the wordline driver coupled to receive an address and select a corresponding wordline for the memory;

read circuitry; and a control circuit for operating the wordline driver and the read circuitry;

wherein the read circuitry comprises:

a column read-out multiplexer (MUX) coupled to a set of columns of the memory, wherein the column read-out MUX receives a column select signal from the control circuit to output a corresponding column output from the set of columns; and a single sense amplifier coupled to receive the corresponding column output of the column read-out MUX, wherein the control circuit directs the wordline driver to turn on a single selected wordline during a first clock cycle, and wherein the control circuit directs the read circuitry to:

precharge bitlines of the memory; and operate the column read-out MUX by individually applying one of n column select signals to the column read-out MUX to connect n columns of the set of columns to the single sense amplifier in corresponding clock cycles starting from a second clock cycle such that all n columns are read out in n+1 clock cycles, where n is an integer equal to or greater than 1, wherein individually applying the one of n column select signals to the column read-out MUX comprises selecting non-consecutive columns in consecutive clock cycles of the n+1 clock cycles, wherein at least one column of the set of columns is skipped during the n+1 clock cycles.

10. The memory circuitry of claim 9, further comprising: a precharge control signal generating circuit that generates a precharging control signal having two different widths, wherein a larger of the two different widths is output for applying voltage to precharge the bitlines of the memory and a smaller of the two different widths is output from the second clock cycle to the n+1 clock cycle for applying voltage to precharge the single sense amplifier.

11. The memory circuitry of claim 10, wherein the larger of the two different widths generated by the precharge control signal generating circuit is output during a first clock cycle to apply voltage to precharge both the bitlines of the memory and the single sense amplifier prior to the second clock cycle.

12. The memory circuitry of claim 10, wherein the precharge control signal generating circuit comprises:

a precharge clock generator that turns on a pulse for the precharging control signal in response to receipt of a clock signal; and a reset circuit structured to receive the pulse for the precharging control signal from an output of the clock generator and a first clock cycle signal from a first clock cycle detector and output a reset signal to the clock generator that turns off the pulse for the precharging control signal, the reset circuit having a first path of a first delay period in response to the first clock cycle signal indicating a detected first clock cycle and a second path of a second delay period for subsequent clock cycles of an operation after the detected first clock cycle, wherein the first delay period for the first clock cycle is larger than the second delay period for the subsequent clock cycles of the operation.

13. The memory circuitry of claim 9, wherein the control circuit directs the wordline driver to maintain the single selected wordline as on until the n+1 clock cycle.

14. The memory circuitry of claim 13, wherein the control circuit comprises a latch structured to go high during the first clock cycle to output a wordline enable signal that directs the wordline driver to turn on the single selected wordline, wherein the latch is further structured to receive a last cycle signal that resets the wordline enable signal such that the wordline driver closes the single selected wordline in response to the last cycle signal indicating the n+1 clock cycle.

15. The memory circuitry of claim 9, further comprising:

a Q retention flop coupled to the single sense amplifier to store an output of the single sense amplifier.

16. The memory circuitry of claim 9, wherein the set of columns comprises four columns of the memory.

17. The memory circuitry of claim 9, wherein the control circuit is structured to receive an address enable signal and generates column select signals based on columns identified by the address enable signal.

18. The memory circuitry of claim 17, wherein the address enable signal is a decoded blast address indicating which of the set of columns are to be accessed.

19. The memory circuitry of claim 17, wherein the control circuit has individual address pins for receiving the address enable signal, each pin corresponding to one column of the set of columns.

* * * * *